(12) United States Patent
Tomiyasu

(10) Patent No.: US 9,726,940 B2
(45) Date of Patent: Aug. 8, 2017

(54) ACTIVE MATRIX SUBSTRATE MANUFACTURING METHOD, DISPLAY APPARATUS MANUFACTURING METHOD, AND DISPLAY APPARATUS

(71) Applicant: Sharp Kabushiki Kaisha, Osaka (JP)

(72) Inventor: Kazuhide Tomiyasu, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 15/107,895

(22) PCT Filed: Aug. 28, 2014

(86) PCT No.: PCT/JP2014/072624
§ 371 (c)(1),
(2) Date: Jun. 23, 2016

(87) PCT Pub. No.: WO2015/098183
PCT Pub. Date: Jul. 2, 2015

(65) Prior Publication Data
US 2016/0327825 A1  Nov. 10, 2016

(30) Foreign Application Priority Data

Dec. 26, 2013 (JP) .................................. 2013-268901

(51) Int. Cl.
*G02F 1/1339* (2006.01)
*H01L 29/786* (2006.01)
(Continued)

(52) U.S. Cl.
CPC ........ *G02F 1/13394* (2013.01); *G02F 1/1368* (2013.01); *G02F 1/13439* (2013.01);
(Continued)

(58) Field of Classification Search
CPC .......................... G02F 1/1339–1/13394; G02F 2001/13396–2001/13398; H01L 27/1248; H01L 27/1259
See application file for complete search history.

(56) References Cited

U.S. PATENT DOCUMENTS 6,004,179 A * 12/1999 Alwan .................... H01J 9/185
445/24
6,475,836 B1 * 11/2002 Suzawa ............. H01L 21/31116
257/E21.252

(Continued)

FOREIGN PATENT DOCUMENTS

JP    H07-201813 A    8/1995
JP    2007-279192 A    10/2007

*Primary Examiner* — Marvin Payen
*Assistant Examiner* — Jeremy Joy
(74) *Attorney, Agent, or Firm* — Chen Yoshimura LLP

(57) ABSTRACT

According to an embodiment of the present invention, an active matrix substrate manufacturing method includes: a step (a) of forming a thin film transistor on a substrate; a step (b) of forming an interlayer insulating layer covering the thin film transistor; a step (c) of forming a first electrode after the step (b); a step (d) of forming, after the step (c), a photospacer by applying a photosensitive resin material to the substrate and patterning the photosensitive resin material; and a step (e) of performing, after the step (d), plasma processing using a gas that contains a fluorine-based gas but does not contain oxygen gas.

6 Claims, 10 Drawing Sheets

(51) Int. Cl.
  *H01L 27/12* (2006.01)
  *G02F 1/1333* (2006.01)
  *G02F 1/1343* (2006.01)
  *G02F 1/1368* (2006.01)
  *G02F 1/13* (2006.01)

(52) U.S. Cl.
  CPC .... *G02F 1/133345* (2013.01); *H01L 27/1248* (2013.01); *H01L 27/1259* (2013.01); *G02F 2001/1316* (2013.01); *G02F 2001/13396* (2013.01); *G02F 2001/13398* (2013.01); *G02F 2001/134372* (2013.01); *G02F 2202/02* (2013.01)

(56) References Cited

U.S. PATENT DOCUMENTS

| | | | | |
|---|---|---|---|---|
| 6,576,926 | B1* | 6/2003 | Yamazaki | G02F 1/13454 257/347 |
| 6,861,670 | B1* | 3/2005 | Ohtani | G02F 1/136227 257/642 |
| 7,078,768 | B2* | 7/2006 | Yamazaki | H01L 29/42384 257/291 |
| 7,667,795 | B2* | 2/2010 | Li | G02F 1/1339 349/104 |
| 2003/0057419 | A1* | 3/2003 | Murakami | G02F 1/13454 257/72 |
| 2003/0173567 | A1* | 9/2003 | Kokubo | H01L 27/1255 257/66 |
| 2005/0012889 | A1* | 1/2005 | Ishii | G02F 1/13394 349/156 |
| 2005/0106768 | A1* | 5/2005 | Onozuka | H01L 27/146 438/30 |
| 2005/0157246 | A1* | 7/2005 | Motomatsu | G02F 1/13392 349/187 |
| 2007/0128738 | A1* | 6/2007 | Kobayashi | G02F 1/133516 438/8 |
| 2007/0231992 | A1* | 10/2007 | Balasubramaniam | G03F 7/427 438/227 |
| 2007/0235138 | A1* | 10/2007 | Tsukamoto | H01L 21/6875 156/345.35 |
| 2009/0289260 | A1* | 11/2009 | Sonoda | G02F 1/133723 257/72 |
| 2010/0065848 | A1* | 3/2010 | Lee | G02F 1/136209 257/59 |
| 2010/0118244 | A1* | 5/2010 | Lee | G02F 1/13394 349/122 |
| 2012/0113347 | A1* | 5/2012 | Shim | G02F 1/13394 349/43 |
| 2012/0268702 | A1* | 10/2012 | Imanishi | G02F 1/13394 349/124 |
| 2013/0049003 | A1* | 2/2013 | Choi | H01L 51/5246 257/72 |
| 2016/0141260 | A1* | 5/2016 | Chang | H01L 21/6836 438/613 |

* cited by examiner (a)

(b)

(c)

(d)

ACTIVE MATRIX SUBSTRATE MANUFACTURING METHOD, DISPLAY APPARATUS MANUFACTURING METHOD, AND DISPLAY APPARATUS

TECHNICAL FIELD

The present invention relates to a method of manufacturing an active matrix substrate including photospacers and a method of manufacturing a display device including such an active matrix substrate. The present invention also relates to a display device manufactured using such a manufacturing method.

BACKGROUND ART

Active matrix-type display devices are currently in wide use. An active matrix-type display device includes an active matrix substrate (also called a "TFT substrate") in which thin film transistors ("TFTs" hereinafter) are formed as switching elements on a pixel-by-pixel basis. For example, an active matrix-type liquid crystal display device generally includes the above-described active matrix substrate, an opposite substrate on which a color filter and the like are formed (also called a "color filter substrate"), and a liquid crystal layer provided between the two substrates.

The thickness of the liquid crystal layer disposed between the active matrix substrate and the opposite substrate (also called a "cell gap") is controlled by spacers disposed between the pair of substrates that oppose each other with the liquid crystal layer therebetween (here, the active matrix substrate and the opposite substrate). In recent years, a method that forms column-shaped spacers on the opposite substrate through a photolithography process using a photosensitive resin material is generally employed (Patent Document 1, for example). Spacers formed in this manner are sometimes called "photospacers", "column-shaped spacers", or "dot-shaped spacers."

RELATED ART DOCUMENTS

Patent Documents

Patent Document 1: Japanese Patent Application Laid-Open Publication No. 2007-279192
Patent Document 2: Japanese Patent Application Laid-Open Publication No. H07-201813

SUMMARY OF THE INVENTION

Problems to be Solved by the Invention

However, when the inventors of the present invention formed photospacers upon an active matrix substrate and created a liquid crystal display device using the active matrix substrate having the photospacers, there were instances of localized unevenness in the display brightness. Note that forming photospacers on the active matrix substrate makes it possible to dispose the photospacers with a higher level of positional precision relative to the pixels than when forming the photospacers on the opposite substrate.

Localized unevenness in the display brightness causes a drop in the display quality of the display device. Upon further investigation, the inventors of the present invention discovered that this localized unevenness in the display brightness is caused by the presence of residue from a photoresist for forming the photospacers (also called "PS residue" hereinafter).

In consideration of the above, a primary aim of the present invention is to provide a method of manufacturing an active matrix substrate capable of suppressing a drop in display quality caused by residue from a photoresist for forming photospacers.

Means for Solving the Problems

A method of manufacturing an active matrix substrate according to an embodiment of the present invention is a method of manufacturing an active matrix substrate that includes a substrate, and a thin film transistor and photospacer supported on the substrate, the method including: a step (a) of forming the thin film transistor on the substrate; a step (b) of forming an interlayer insulating layer covering the thin film transistor; a step (c) of forming a first electrode after the step (b); a step (d) of forming, after the step (c), the photospacer by applying a photosensitive resin material to the substrate and patterning the photosensitive resin material; and a step (e) of performing, after the step (d), plasma processing using a gas that contains a fluorine-based gas but that does not contain oxygen gas.

According to an embodiment, in the step (e), the plasma processing is performed substantially using only a fluorine-based gas.

According to an embodiment, the fluorine-based gas is a $CF_4$ gas or a $C_2F_6$ gas.

According to an embodiment, the method of manufacturing an active matrix substrate further includes, after the step (b) and before the step (c): a step (b1) of forming an organic insulating layer on the interlayer insulating layer, wherein in the step (c), the first electrode is formed so as to connect to the organic insulating layer. The organic insulating layer is a photosensitive resin layer, for example.

According to an embodiment, the method of manufacturing an active matrix substrate further includes, after the step (b) and before the step (c): a step (b1) of forming an organic insulating layer on the interlayer insulating layer; a step (b2) of forming a second electrode on the organic insulating layer; and a step (b3) of forming a dielectric layer on the second electrode, wherein in the step (c), the first electrode is formed on the dielectric layer.

According to an embodiment, the step (b2) includes a step of forming a conductive film on the organic insulating layer so as to connect to the organic insulating layer and a step of forming the second electrode and forming another conductive layer separate from the second electrode by patterning the conductive film, and the step (b3) includes a step of forming a dielectric film on the second electrode and on the conductive layer and a step of patterning the dielectric film so as to cover the second electrode but expose the conductive layer and the organic insulating layer in a periphery of the conductive layer.

A method of manufacturing a display device according to an embodiment of the present invention is a method of manufacturing a display device that includes an active matrix substrate, an opposite substrate that opposes the active matrix substrate, and a display medium layer disposed between the active matrix substrate and the opposite substrate, the method including: a step (A) of manufacturing the active matrix substrate according to the method of manufacturing the active matrix substrate according to any one of the above; a step (B) of preparing the opposite substrate; a step (C) of bonding the opposite substrate and the active matrix substrate together so that the opposite substrate opposes the active matrix substrate; and a step (D) of forming the display medium layer before or after the step (C).

According to an embodiment, the display medium layer is a liquid crystal layer.

A display device according to an embodiment of the present invention is a display device manufactured via the method of manufacturing according to either of the above.

Effects of the Invention

According to an embodiment of the present invention, it is possible to provide a method of manufacturing an active matrix substrate capable of suppressing a drop in display quality caused by residue from a photoresist for forming photospacers.

DETAILED DESCRIPTION OF EMBODIMENTS

Figure 1:
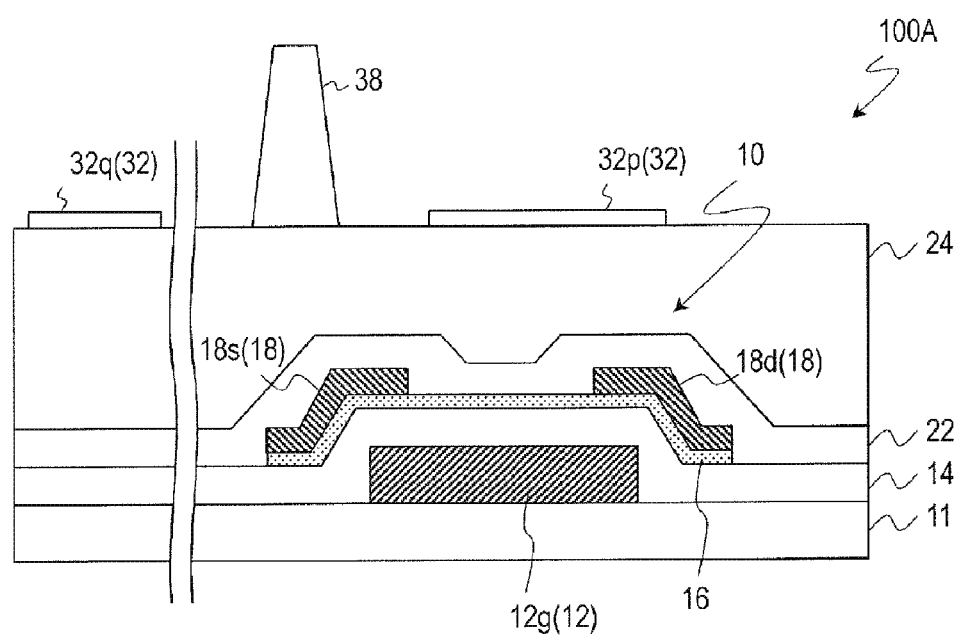
FIG. 1 is a schematic cross-sectional view of a TFT substrate obtained through a manufacturing method according to an embodiment of the present invention.

Hereinafter, an active matrix substrate manufacturing method, a display device manufacturing method, and a display device according to embodiments of the present invention will be described with reference to the drawings. However, the present invention is not intended to be limited to the exemplary embodiments. In the following descriptions, constituent elements having substantially identical functions will be given identical reference numerals, and descriptions thereof will be omitted.

First, the overall structure of an active matrix substrate obtained using the manufacturing method according to an embodiment of the present invention will be described with reference to FIG. 1. The active matrix substrate obtained using the manufacturing method according to the embodiment of the present invention can be used in a liquid crystal display device, for example, but is not limited thereto, and can be used in a variety of display devices having photospacers. A TFT substrate for a liquid crystal display device will be described here as an example of the active matrix substrate. Although there are no special limitations on a display mode of the liquid crystal display device, this example will describe a TFT substrate used in a liquid crystal display device that displays in a VA (Vertical Alignment) mode. An example of a display device according to an embodiment of the present invention will be described later with reference to FIGS. 8 and 9.

FIG. 1 illustrates a schematic cross-section of a TFT substrate obtained through a manufacturing method according to an embodiment of the present invention. FIG. 1 illustrates both a region corresponding to a single pixel of a liquid crystal display device and a region to serve as a non-display region of the liquid crystal display device. The non-display region of the liquid crystal display device is a peripheral region on an outer side of a display region of the liquid crystal display device formed by pixels arranged in a matrix, and is also called a "peripheral region."

A TFT substrate 100A illustrated in FIG. 1 includes a substrate (typically a transparent substrate) 11, a TFT 10 supported by the substrate 11, and a photospacer (column-shaped spacer) 38. As illustrated in FIG. 1, the TFT 10 includes a gate electrode 12g, a gate insulation film 14 covering the gate electrode, an island-shaped semiconductor layer 16, a source electrode 18s, and a drain electrode 18d. An interlayer insulating layer 22 is formed so as to cover the entire TFT 10. In the configuration illustrated in FIG. 1, an organic insulating layer 24 is formed on the interlayer insulating layer 22, and a pixel electrode 32p is formed on the organic insulating layer 24. The pixel electrode 32p is electrically connected to the drain electrode 18d of the TFT 10 through a contact hole (not shown) provided in the organic insulating layer 24 and the interlayer insulating layer 22.

Generally speaking, photospacers are formed on an opposite substrate that opposes the TFT substrate (Patent Document 1, for example). However, in this embodiment of the present invention, the photospacers are formed on the TFT substrate. Forming photospacers on the TFT substrate makes it possible to dispose the photospacers with a higher level of positional precision relative to the pixels than when forming the photospacers on the opposite substrate. This is because a photomask can be aligned with a higher degree of precision than the precision of positioning when the opposite substrate and the TFT substrate are laminated together.

Although this will be described in detail later, in the active matrix substrate manufacturing method according to this embodiment of the present invention, the photospacers are formed by patterning a photosensitive resin material. The photospacers can be formed by exposing a layer of the photosensitive resin material (photosensitive resin) over a photomask, developing the exposed photosensitive resin material layer, and then removing unnecessary portions of the photosensitive resin material. At this time, there are cases where the unnecessary portions of the photosensitive resin material are not completely removed and remain on the pixel electrodes and the like (PS residue). As will be described below, the display quality of the liquid crystal display device will drop if the liquid crystal display device is assembled without removing such PS residue.

Figure 10:
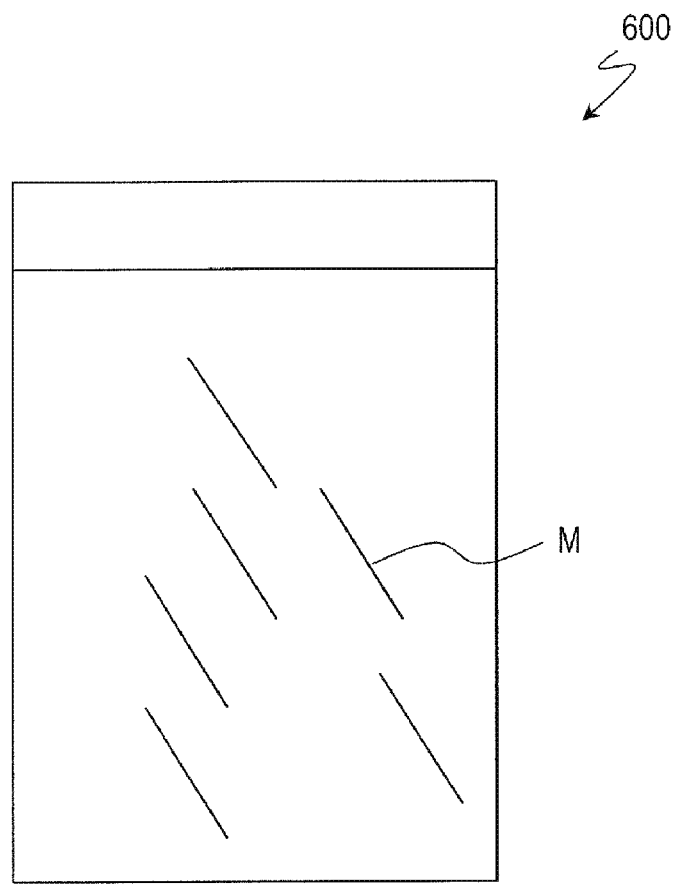
FIG. 10 is a plan view schematically illustrating black marks arising in a liquid crystal display device.

When PS residue is present on the pixel electrodes, there are cases where a liquid crystal layer becomes thinner at that part and/or the orientation of liquid crystal molecules is disturbed in the vicinity thereof, which in turn produces localized unevenness in the display brightness. This unevenness in brightness arises in dot form and/or in line form, and appears (when the liquid crystal display device is lit) as black dots, black lines, or the like (called "black marks" hereinafter), for example. The black marks also arise in different positions of the liquid crystal display device depending on the position of the TFT substrate in a mother glass. For example, linear black marks appear toward the outer sides of the mother glass. FIG. 10 schematically illustrates the black marks arising in the liquid crystal display device. In the example illustrated here, linear black marks M arise in a liquid crystal display device 600.

The inventors of the present invention carried out an elemental analysis on the surface of the pixel electrodes in parts of the liquid crystal display device where the black marks had arisen. Specifically, the inventors disassembled the liquid crystal display device and removed an orientation film (polyimide film), and then analyzed the surfaces of the pixel electrodes at parts where black marks had arisen using secondary ion mass spectrometry (SIMS). The analysis revealed the presence of carbon atoms (C) at the parts where the black marks had arisen. As such, PS residue is thought to be the cause of the black marks.

Accordingly, the inventors of the present invention considered the possibility of using plasma processing to remove the PS residue. Plasma processing using oxygen gas is employed in the removal of resists in processes for manufacturing semiconductor substrates (see Patent Document 2, for example). A technique in which high-frequency waves are used to turn oxygen gas into plasma, and the plasma is then used to remove a resist no longer needed after an etching process by turning the resist into a volatile gas, is sometimes referred to as "ashing." A mixed gas of oxygen gas and a fluorine-based gas is sometimes used to achieve a high ashing rate. Note that the present specification also uses the term "ashing" in cases where plasma from a gas aside from oxygen gas is used.

Figure 2:
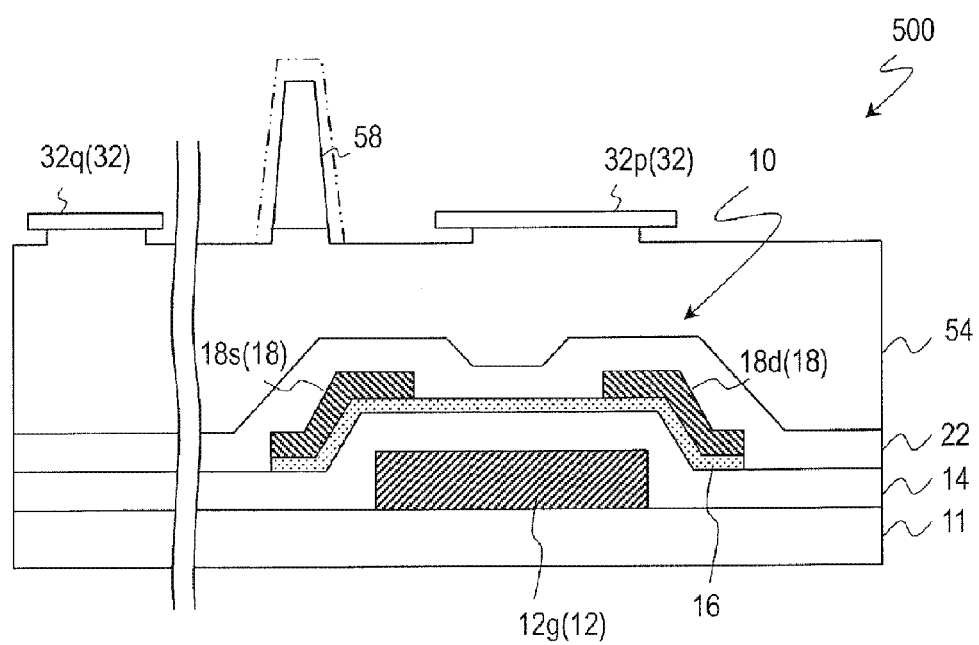
FIG. 2 is a schematic cross-sectional view of a TFT substrate 500 according to a comparison example.

However, if this technique is used as-is on a TFT substrate on which photospacers are formed, both the PS residue and the photospacers will be exposed to the oxygen plasma. As indicated by a TFT substrate 500 according to a comparison example illustrated in FIG. 2, this reduces the size of a photospacer 58. In other words, the height and width of the photospacer 58 will be smaller than the design values thereof. A two-dot chain line in FIG. 2 indicates a state prior to the oxygen plasma process. If the height of the photospacer 58 is less than the design value, a desired cell gap cannot be achieved and the display quality of the liquid crystal display device will drop. Even if the power, the flow rate of the oxygen gas, or the like is adjusted, the photospacer 58 cannot be effectively suppressed from becoming smaller while also ensuring PS residue is removed.

Meanwhile, in a structure where the pixel electrode 32p (or a conductive layer 32q in the same layer as the pixel electrode 32p) is formed so as to make contact with an organic insulating layer 54, the organic insulating layer 54 beneath the pixel electrode 32p will also be broken down by the oxygen plasma (side etching; see FIG. 2), resulting in a risk of the pixel electrode 32p separating.

After diligent investigations, the inventors of the present invention discovered that PS residue can be removed while suppressing a reduction in the size of the photospacers by first forming the photospacers and then carrying out plasma processing using a gas that contains a fluorine-based gas but does not contain oxygen gas.

Figure 3:
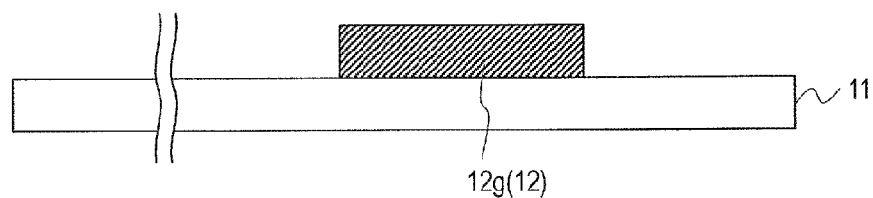
FIGS. 3(a) to (d) are cross-sectional views illustrating steps in a method of manufacturing a TFT substrate 100A.
Figure 3:
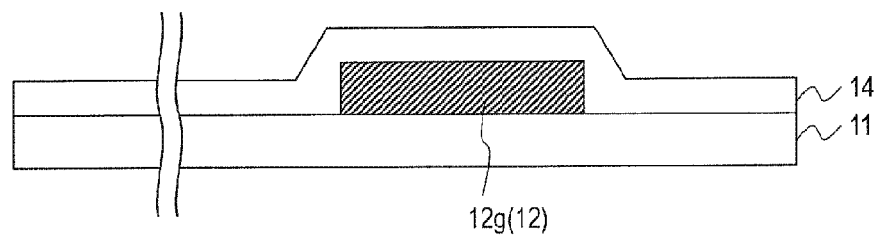
Figure 3:
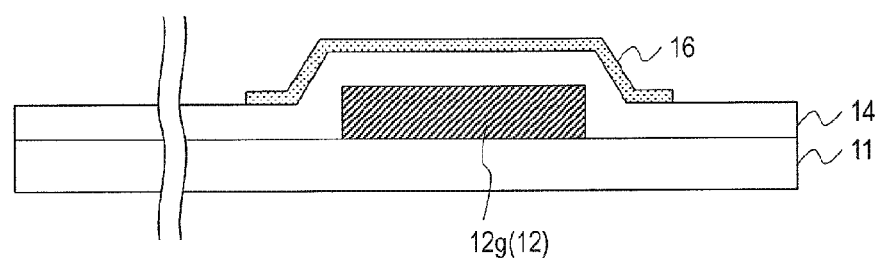
Figure 3:
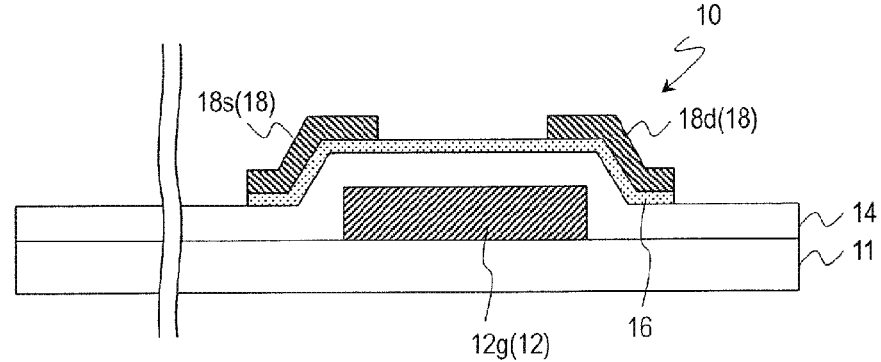
Figure 4:
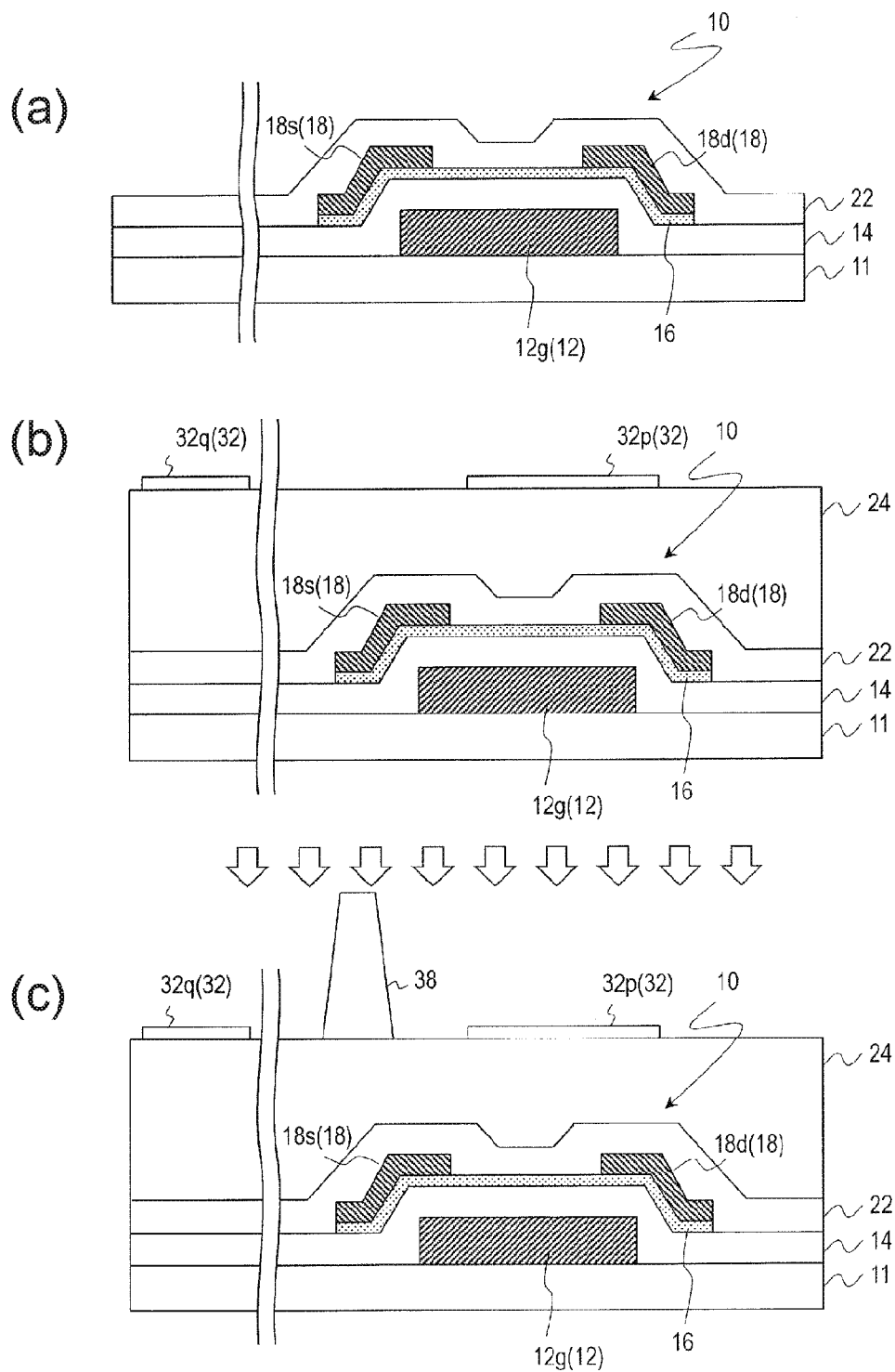
FIGS. 4(a) to (c) are cross-sectional views illustrating steps in the method of manufacturing the TFT substrate 100A.

A method of manufacturing the TFT substrate 100A according to this embodiment of the present invention will be described hereinafter with reference to FIGS. 3 and 4. FIGS. 3(a) to (d) and FIGS. 4(a) to (c) are cross-sectional views illustrating steps in the method of manufacturing the TFT substrate 100A.

First, the substrate 11 is prepared. A glass substrate, a silicon (Si) substrate, a heat-resistant plastic substrate (a resin substrate), or the like can be used as the substrate 11. Polyethylene terephthalate (PET), polyethylene naphthalate (PEN), polyether sulfone (PES), an acrylic resin, polyimide, or the like can be used effectively as a material of a plastic substrate (resin substrate). A plastic composite material obtained by mixing a filler (fibers, a nonwoven fabric, or the like) into such a resin material may be used as well. Here, however, a glass substrate is used.

Next, the gate electrode 12g is formed on the substrate 11, as illustrated in FIG. 3(a). The gate electrode 12g can be formed by depositing a conductive film ("gate metal film" hereinafter) on the substrate 11 through sputtering or the like and then patterning the gate metal film using a photolithography process. A gate metal layer 12 formed from the gate metal film can include a gate bus line formed integrally with the gate electrode 12g, a CS bus line, or a CS electrode (none of which are shown).

A metal such as aluminum (Al), tungsten (W), molybdenum (Mo), tantalum (Ta), chromium (Cr), titanium (Ti), copper (Cu), or the like, an alloy thereof, or a nitride thereof can be used as the material of the gate metal film. Rather than being a single-layer film formed from the above materials, the gate metal film may be a multilayer film formed from the above materials. Here, the gate metal layer 12 including the gate electrode 12g and the like is formed, for example, by forming the gate metal film (film thickness: 300 nm) as a multilayer structure including an aluminum (Al) film and a titanium (Ti) film through sputtering, and then patterning the gate metal film using a photolithography process.

Next, the gate insulation film 14 is deposited on the gate metal layer 12, as illustrated in FIG. 3(b). The gate insulation film 14 can be formed using CVD (Chemical Vapor Deposition), for example. Silicon dioxide ($SiO_2$), silicon nitride ($SiN_x$), silicon oxide nitride ($SiO_xN_y$, x>y), silicon nitride oxide ($SiN_xO_y$, x>y), or the like can be used as the material of the gate insulation film 14, for example. The gate insulation film 14 may be a single-layer film or a multilayer film. When a two-layer film is to be used as the gate insulation film 14, it is preferable that a lower-layer insulating film be formed using silicon nitride ($SiN_x$), silicon nitride oxide ($SiN_xO_y$, x>y), or the like, for example, and that an upper-layer insulating film be formed using silicon dioxide ($SiO_2$), silicon oxide nitride ($SiO_xN_y$, x>y), or the like, for example, in order to prevent impurities or the like from diffusing from the substrate 11, for example. Meanwhile, a dense insulating film can be deposited at a comparatively low temperature by mixing a noble gas such as argon (Ar) or the like with the reactant gas. A dense insulating film can provide an effect of reducing gate leak current. Here, the gate insulation film 14 is formed, for example, by forming a silicon nitride film (film thickness: 100 nm to 400 nm) as the lower-layer insulating film, and then forming a silicon dioxide film (film thickness: 50 nm to 100 nm) thereupon as the upper-layer insulating film, through CVD using $SiH_4$ and $NH_3$ as reactant gases.

Next, the island-shaped semiconductor layer 16 is formed on the gate insulation film 14, as illustrated in FIG. 3(c). The semiconductor layer 16 can be formed by depositing a semiconductor film on the gate insulation film 14 through sputtering, CVD, or the like and then patterning the semiconductor film using a photolithography process. The semiconductor layer 16 of the TFT 10 may contain an oxide semiconductor. Here, an island-shaped oxide semiconductor layer is formed, for example, by depositing an oxide semiconductor film (film thickness: 30 to 100 nm) through sputtering and then patterning the oxide semiconductor film using a photolithography process.

The oxide semiconductor layer contains an In—Ga—Zn—O-based semiconductor ("In—Ga—Zn—O semiconductor" hereinafter), for example. Here, the In—Ga—Zn—O semiconductor is a ternary oxide of In (indium), Ga (gallium), and Zn (zinc), and no special limitations are placed on a ratio (compositional ratio) of In, Ga, and Zn. For example, the ratio includes In:Ga:Zn=2:2:1, In:Ga:Zn=1:1:1, In:Ga:Zn=1:1:2, and the like. In the present embodiment, the oxide semiconductor layer may be a In—Ga—Zn—O semiconductor layer containing In, Ga, and Zn at a ratio of In:Ga:Zn=1:1:1, for example.

A TFT including a In—Ga—Zn—O semiconductor layer has a high degree of movement (more than twenty times that of a TFT that uses an amorphous silicon (a-Si) film as its active layer) and a low leak current (less than 1/100 that of a TFT that uses an a-Si film as its active layer), and can thus be effectively used as a driving TFT and a pixel TFT. Using a TFT including a In—Ga—Zn—O semiconductor layer makes it possible to greatly reduce the amount of power consumed by the display device.

The In—Ga—Zn—O semiconductor may be amorphous, or may contain crystalline parts. A crystalline In—Ga—Zn—O semiconductor in which a c axis is oriented substantially perpendicular to the layer surface is preferable as the crystalline In—Ga—Zn—O semiconductor. Such a crystal structure for a In—Ga—Zn—O semiconductor is disclosed in Japanese Patent Application Laid-Open Publication No. 2012-134475, for example. The entire disclosure of Japanese Patent Application Laid-Open Publication No. 2012-134475 is incorporated into the present specification by reference.

The oxide semiconductor layer may contain another oxide semiconductor instead of the In—Ga—Zn—O semiconductor. For example, the layer may contain a Zn—O semiconductor (ZnO), an In—Zn—O semiconductor (IZO (registered trademark)), a Zn—Ti—O semiconductor (ZTO), a Cd—Ge—O semiconductor, a Cd—Pb—O semiconductor, $InGaO_3(ZnO)_5$, magnesium zinc oxide ($Mg_xZn_{1-x}O$), cadmium zinc oxide ($Cd_xZn_{1-x}O$), cadmium oxide (CdO), a Mg—Zn—O semiconductor, a In—Sn—Zn—O semiconductor ($In_2O_3$—$SnO_2$—$ZnO$, for example), a In—Ga—Sn—O semiconductor, or the like. ZnO in a non-crystalline (amorphous) state, a polycrystalline state, or a microcrystalline state containing both non-crystalline and polycrystalline states, to which one or a plurality of types of impurity elements selected from a group 1 element, a group 13 element, a group 14 element, a group 15 element, a group 17 element, and the like have been added, or ZnO without any impurity elements added thereto, can be used as a Zn—O semiconductor.

Next, the source electrode 18s and the drain electrode 18d are formed on the semiconductor layer 16, as illustrated in FIG. 3(d). The source electrode 18s and the drain electrode 18d can be formed by depositing a conductive film ("source metal film" hereinafter) on the substrate 11 through sputtering or the like and then patterning the source metal film using a photolithography process. A source metal layer 18 formed from the source metal film can include a source bus line formed integrally with the source electrode 18s, a drain extension wire/electrode (a wire/electrode opposing a CS bus line or a CS electrode and forming a CS capacitance), and the like (none of which are shown). Note that either dry etching or wet etching can be employed in the etching of the photolithography process. However, in the case where the substrate has a large surface area, dry etching is advantageous from the standpoint of reducing dimensional shift (etching shift) in a line width.

A metal such as aluminum (Al), molybdenum (Mo), copper (Cu), titanium (Ti), or the like, an alloy thereof, or a nitride thereof can be used as the material of the source metal film. Rather than being a single-layer film formed from the above materials, the source metal film may be a multilayer film formed from the above materials. The source metal layer may be transparent, and the source metal film may be formed using a light-transmissive conductive material such as indium tin oxide (ITO), indium zinc oxide (IZO (registered trademark)), indium tin oxide containing silicon oxide (ITSO), indium oxide ($In_2O_3$), tin oxide ($SnO_2$), zinc oxide (ZnO), titanium oxide, or the like, for example. These may be used in appropriate combinations as well. Here, the source metal layer 18 including the source electrode 18s, the drain electrode 18d, and the like is formed, for example, by forming the a titanium (Ti) film, an aluminum (Al) film, and a titanium (Ti) film through sputtering so as to form a multilayer structure (Ti/Al/Ti) source metal film, and then patterning the source metal film using a photolithography process. The TFT 10 can be formed on the substrate 11 in this manner.

Next, the interlayer insulating layer 22 is formed covering the TFT 10, as illustrated in FIG. 4(a). An insulating film (interlayer insulating film) for forming the interlayer insulating layer 22 can be formed using plasma CVD, sputtering, or the like, for example. Typically, the interlayer insulating film is deposited on substantially the entire surface of the substrate 11.

Silicon dioxide ($SiO_2$), silicon nitride ($SiN_x$), silicon oxide nitride ($SiO_xN_y$, x>y), silicon nitride oxide ($SiN_xO_y$, x>y), or the like can be used as the material of the interlayer insulating film, for example. The interlayer insulating film may be a single-layer film or a multilayer film having two or more layers. Here, the interlayer insulating film is formed, for example, by sequentially layering a silicon dioxide ($SiO_2$) film and a silicon nitride ($SiN_x$) film through CVD.

Then, the substrate as a whole is subjected to thermal processing (for one hour at approximately 350° C.). By carrying out the thermal processing, a reaction layer can be formed at a border between the oxide semiconductor layer (the semiconductor layer 16) and a Ti layer (the Ti layer, of the source electrode 18s and the drain electrode 18d, located on the substrate 11 side), and contact resistance can be reduced. In the present specification, such a reaction layer and the oxide semiconductor layer may be collectively referred to as a "semiconductor layer." Additionally, as a result of a channel region of the oxide semiconductor layer being oxidized, oxygen loss within the channel region can be reduced, making it possible to achieve desired TFT characteristics. After the thermal processing, the drain electrode 18d and an opening (not shown) for connecting the pixel electrode 32p, described later, are formed in the interlayer insulating film using a photolithography process. The interlayer insulating layer 22 is obtained as a result.

Next, the organic insulating layer 24 is formed on the interlayer insulating layer 22. To be more specific, the organic insulating layer 24 is formed, for example, by applying a positive photosensitive resin material (an acrylic resin material, for example) upon the interlayer insulating layer 22 and then patterning the photosensitive resin material film using a photolithography process. The organic insulating layer 24 also functions as a planarizing layer. Part of the surface of the drain electrode 18d is exposed by forming an opening (not shown) in the organic insulating layer 24 in a location that overlaps with the opening in the interlayer insulating layer 22 in the patterning process. A contact hole (not shown) for connecting the drain electrode 18d and the pixel electrode 32p, described later, can be formed by the opening in the interlayer insulating layer 22 and the opening in the organic insulating layer 24. Note that a negative photosensitive resin material may be used to form the organic insulating layer 24.

Next, the pixel electrode 32p is formed, as illustrated in FIG. 4(b). A transparent conductive layer 32 having the pixel electrode 32p can be formed by depositing a transparent conductive film on the organic insulating layer 24 through sputtering or the like and then patterning the transparent conductive film using a photolithography process. Iridium tin oxide (ITO), indium zinc oxide (IZO (registered trademark)), or the like can be used as the material of the transparent conductive film. The pixel electrode 32p is electrically connected to the drain electrode 18d of the TFT 10 through the above-described contact hole.

Another conductive layer, separate from the pixel electrode 32p, may be formed along with the pixel electrode 32p in the process of forming the pixel electrode 32p on the organic insulating layer 24, as illustrated in FIG. 4(b). In the example illustrated in the drawings, the conductive layer 32q, which is in the same layer as the pixel electrode 32p, is formed in a region to serve as the non-display region (peripheral region) of the display device by patterning the transparent conductive film deposited on the organic insulating layer 24. In other words, in the example illustrated in the drawings, the transparent conductive layer 32 includes the pixel electrode 32p and the conductive layer 32q. The pixel electrode 32p and the conductive layer 32q can be formed so as to make contact with the organic insulating layer 24. In addition to a sealing portion for laminating the two substrates (the TFT substrate and the opposite substrate) disposed opposing each other with the liquid crystal layer interposed therebetween, a terminal portion, and furthermore a driving circuit portion, are sometimes formed in the peripheral region as well. The conductive layer 32q can be used as an electrode, a wire, or the like of such a terminal portion and/or driving circuit portion.

Next, the photospacer 38 is formed by applying a photosensitive resin material upon the substrate 11 and patterning that material. An ultraviolet light-curable resin can be used as the photosensitive resin, and for example, a known acrylic ultraviolet light-curable resin (a negative photoresist, for example) can be used. To be more specific, a solution containing an acrylic ultraviolet light-curable resin at 20 to 30 wt % and a solvent such as diethylene glycol methyl ethyl ether at 60 to 70 wt % is applied, using spin coating, upon the substrate 11 on which the pixel electrode 32p has been formed, and is then pre-baked for 10 minutes at 90° C., for example. The substrate is then irradiated with ultraviolet light over a prescribed photomask, and then developed using a developer (a tetra-methyl ammonium aqueous solution (0.1 wt %), for example). The substrate is then post-baked for 60 minutes at 200° C., for example. The photospacer 38 is formed as a result.

The photospacer 38 is formed in a position overlapping with the TFT 10 disposed for a single pixel, for example. The photospacer 38 may be formed in a position overlapping with a gate bus line or a source bus line. The photospacer 38 has a height of 4 μm, for example.

Next, plasma processing is carried out, as illustrated in FIG. 4(c). In this embodiment of the present invention, the plasma processing is executed using a gas that contains a fluorine-based gas but does not contain oxygen gas. The plasma processing may be executed substantially using only a fluorine-based gas. $CF_4$ gas or $C_2F_6$ gas can be used as the fluorine-based gas, and thus the plasma processing can be executed using only $CF_4$ or $C_2F_6$.

A chamber internal pressure, a gas flow rate, a stage temperature (which may also be called a temperature of an electrode used to control the temperature of a stage), and a high-frequency wave output in the plasma processing can each be adjusted as appropriate within the following ranges, for example.

chamber internal pressure: 10 to 15 Pa
gas flow rate: 100 to 300 sccm (0° C., $10^5$ Pa)
stage temperature: 60° C.
high-frequency wave output: 500 to 1000 W The TFT substrate 100A illustrated in FIG. 1 is obtained as a result.

As described thus far, according to the method of manufacturing the TFT substrate according to this embodiment of the present invention, plasma processing is carried out to remove PS residue, using a gas that contains a fluorine-based gas but does not contain oxygen gas. Plasma processing using a gas that contains a fluorine-based gas but does not contain oxygen gas has a lower ashing rate than plasma processing using oxygen gas, and thus an amount by which the height of the photospacers decreases can be reduced. Additionally, the comparatively low ashing rate results in less in-plane variation in the sizes of the photospacer, as compared to a case where the plasma processing is executed using oxygen gas.

According to this embodiment of the present invention, PS residue on the pixel electrode 32p can be removed while suppressing a drop in the size of the photospacer 38. Additionally, compared to a case where plasma processing using oxygen gas is employed, breakdown (side etching) in the organic insulating layer 24 below the pixel electrode 32p can be suppressed, which makes it possible to suppress the pixel electrode 32p from separating. The conductive layer 32q can also be prevented from separating in the case where the conductive layer 32q in the same layer as the pixel electrode 32p is formed so as to make contact with the organic insulating layer 24. As such, according to this embodiment of the present invention, a structure in which the comparatively thick organic insulating layer 24 is interposed between the TFT 10 and the pixel electrode 32p can be employed, and PS residue can be removed while also preventing the electrode and/or wire formed so as to make contact with the organic insulating layer 24 from separating.

Although the foregoing describes a bottom-gate structure as an example of the TFT element structure, the TFT element structure may be a top-gate structure instead. Additionally, although the foregoing describes a case where the semiconductor layer 16 is an oxide semiconductor layer as an example, another semiconductor material may be used as the material of the semiconductor layer 16. For example, a silicon-based material such as amorphous silicon, microcrystalline silicon, polycrystalline silicon, continuous grain silicon (CGS), or the like may be used as the material of the semiconductor layer 16. Note also that depending on the semiconductor material used, a contact layer for forming an ohmic junction may be formed between the source electrode 18s and a source region of the semiconductor layer 16 and between the drain electrode 18d and a drain region of the semiconductor layer 16.

An etching stop layer that covers the channel region of the semiconductor layer 16 in the TFT 10 may be formed in the process of forming the TFT 10 on the substrate 11. In other words, the etching stop layer may be formed on the substrate 11 after the island-shaped semiconductor layer 16 is formed and before the source metal layer 18 including the source electrode 18s, the drain electrode 18d, and the like is formed.

Figure 5:
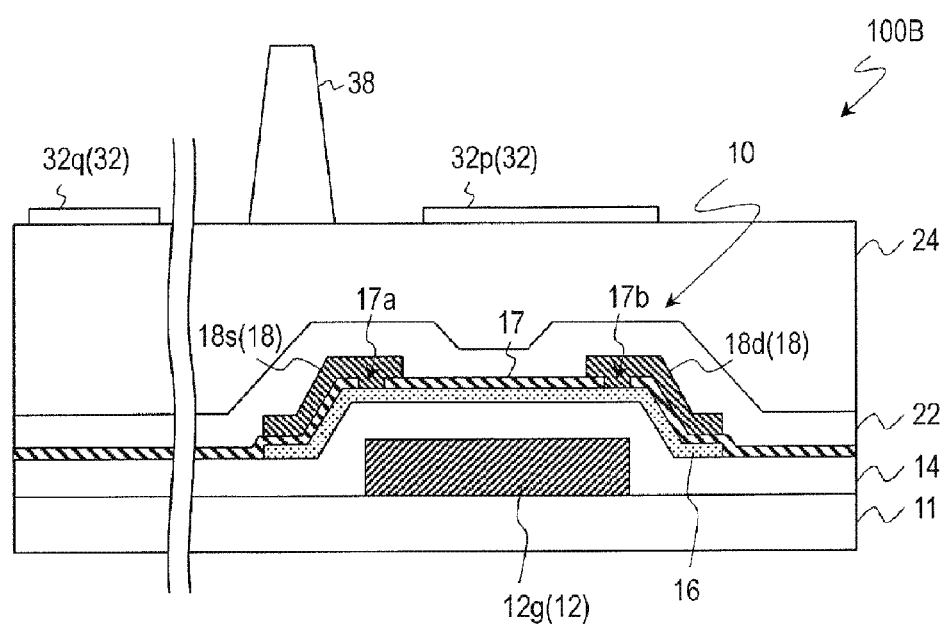
FIG. 5 is a schematic cross-sectional view of a TFT substrate 100B having an etching stop layer 17 covering a channel region of a semiconductor layer 16 in a TFT 10.

FIG. 5 schematically illustrates a cross-section of a TFT substrate 100B obtained by such a modification example. As illustrated in FIG. 5, the TFT substrate 100B includes an etching stop layer 17 that covers the channel region of the semiconductor layer 16 in the TFT 10. In the example illustrated in the drawing, the etching stop layer 17 is formed so as to cover the semiconductor layer 16 and the gate insulation film 14; a first opening 17a that exposes the source region of the semiconductor layer 16 and a second opening 17b that exposes the drain region of the semiconductor layer 16 are provided in the etching stop layer 17. The source electrode 18s and the drain electrode 18d are electrically connected to the semiconductor layer 16 through the first opening 17a and the second opening 17b, respectively.

The etching stop layer 17 can be formed by depositing a protective film on the semiconductor layer 16 and patterning the protective film. More specifically, after the semiconductor layer 16 is formed, a protective film (thickness: greater than or equal to 30 nm and less than or equal to 200 nm, for example) is deposited on the semiconductor layer 16 through CVD, for example. A silicon dioxide ($SiO_2$) film, a silicon nitride film, a silicon oxide nitride film, or a multilayer film constituted of these films is an example of such a protective film. Next, the protective film is patterned using a photolithography process. The patterning is executed so that a region of the semiconductor layer 16 that is to serve as the channel region is covered by the etching stop layer 17. Forming the etching stop layer 17 before forming the source metal layer 18 makes it possible to reduce processing damage to the semiconductor layer 16.

Next, the overall structure of an active matrix substrate obtained using a manufacturing method according to another embodiment of the present invention will be described with reference to FIG. 6.

Figure 6:
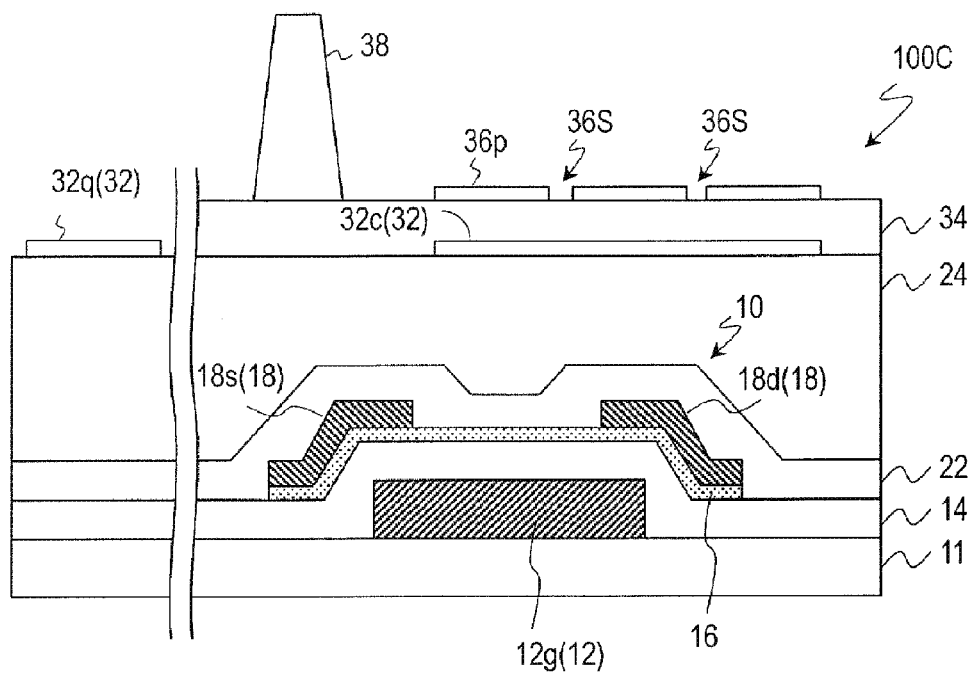
FIG. 6 is a schematic cross-sectional view of a TFT substrate obtained through a manufacturing method according to another embodiment of the present invention.

Like the TFT substrate 100A illustrated in FIG. 1, a TFT substrate 100C illustrated in FIG. 6 includes the substrate 11, the TFT 10 supported by the substrate 11, and the photospacer (column-shaped spacer) 38. As illustrated in FIG. 6, the TFT substrate 100C has a "dual-layer electrode structure." Here, dual-layer electrode structure refers to a structure in which a lower-layer electrode, a dielectric layer that covers the lower-layer electrode, and an upper-layer electrode that overlaps with the lower-layer electrode with the dielectric layer interposed therebetween are provided on an interlayer insulating layer that covers the thin film transistor.

In the configuration illustrated in FIG. 6, the TFT substrate 100C includes a lower-layer electrode 32c formed on the organic insulating layer 24, a dielectric layer 34 that covers the lower-layer electrode 32c, and an upper-layer electrode 36p that overlaps with the lower-layer electrode 32c with the dielectric layer 34 interposed therebetween. The upper-layer electrode 36p and the lower-layer electrode 32c are both formed from a transparent conductive material. As illustrated in FIG. 6, the photospacer 38 of the TFT substrate 100C is disposed on the dielectric layer 34.

The TFT substrate 100C is used in a liquid crystal display device that displays in an FFS (Fringe Field Switching) mode, for example. In a display mode such as the FFS mode, where a horizontal electric field is applied to the liquid crystal layer, the TFT substrate is provided with a common electrode. According to the TFT substrate 100C, the lower-layer electrode 32c in the dual-layer electrode structure can be caused to function as the common electrode, for example. The lower-layer electrode 32c is formed so as to be continuous across all of the pixels in the liquid crystal display device. The upper-layer electrode 36p in the dual-layer electrode structure is electrically connected to the drain electrode 18d of the TFT 10 through contact holes (not shown) provided in the dielectric layer 34, the organic insulating layer 24, and the interlayer insulating layer 22, and thus functions as a pixel electrode. The upper-layer electrode 36p is formed independently (in a segmented manner) for each pixel in the liquid crystal display device, and at least one slit 36S (a plurality, here) is formed in the upper-layer electrode 36p. Note that the lower-layer electrode 32c may be caused to function as the pixel electrode in the FFS mode and the upper-layer electrode 36p may be caused to function as the common electrode in the FFS mode.

Figure 7:
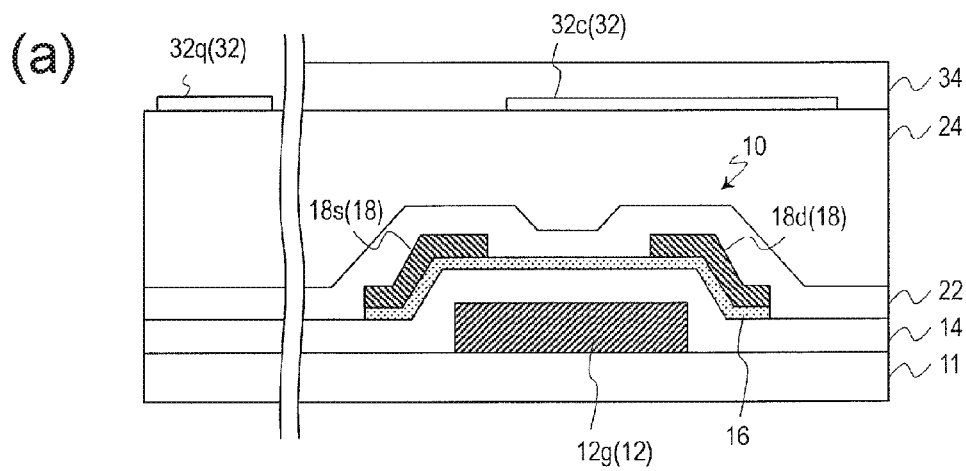
FIGS. 7(a) to (c) are cross-sectional views illustrating steps in a method of manufacturing a TFT substrate 100C.
Figure 7:
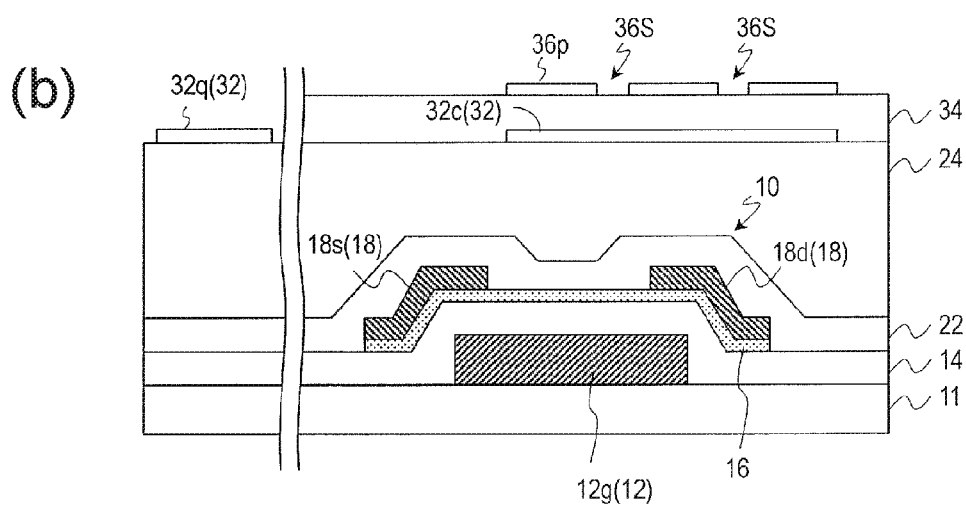
Figure 7:
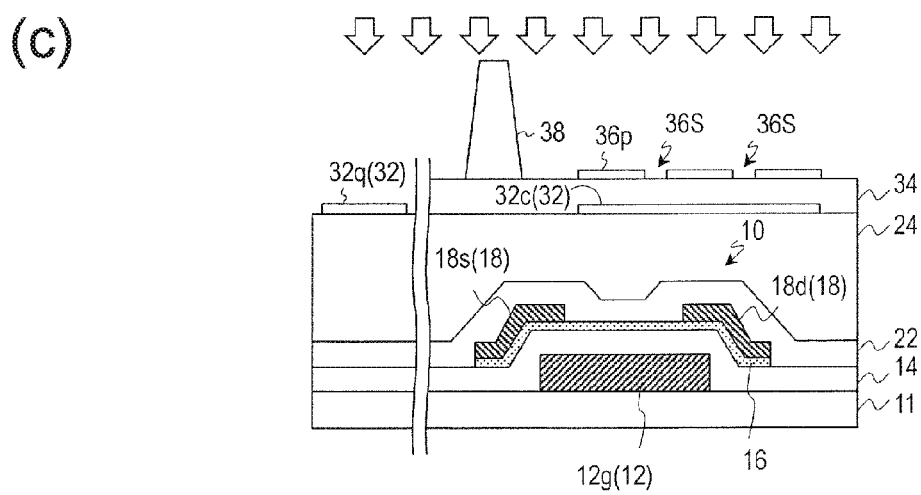

Next, a method of manufacturing the TFT substrate 100C will be described with reference to FIG. 7. FIGS. 7(a) to (c) are cross-sectional views illustrating steps in the method of manufacturing the TFT substrate 100C. Aside from the formation of the dual-layer electrode structure on the organic insulating layer 24, the method of manufacturing the TFT substrate 100C is substantially the same as the method of manufacturing the TFT substrate 100A described earlier with reference to FIGS. 3(a) to (c) and FIGS. 4(a) to (c). As such, descriptions and illustrations of parts of the method of manufacturing the TFT substrate 100C that are the same as in the method of manufacturing the TFT substrate 100A will be omitted here.

FIG. 7(a) will be referred to first. After the interlayer insulating layer 22 is formed, the organic insulating layer 24 is formed on the interlayer insulating layer 22 and the lower-layer electrode 32c is formed on the organic insulating layer 24. More specifically, the transparent conductive layer 32 having the lower-layer electrode 32c is formed by depositing a transparent conductive film on the organic insulating layer 24 through sputtering or the like and then patterning the transparent conductive film using a photolithography process. Iridium tin oxide (ITO), indium zinc oxide (IZO (registered trademark)), or the like can be used as the material of the transparent conductive film.

The conductive layer 32q, separate from the lower-layer electrode 32c, may be formed along with the lower-layer electrode 32c at this time by patterning a transparent conductive film formed so as to make contact with the organic insulating layer 24. The conductive layer 32q in the same layer as the lower-layer electrode 32c can, for example, be formed in a region to serve as the non-display region (peripheral region) of the display device and used as an electrode, a wire, or the like of the terminal portion and/or the driving circuit portion.

Next, the dielectric layer 34 is formed on the lower-layer electrode 32c (on the transparent conductive layer 32). An insulating film (dielectric film) for forming the dielectric layer 34 can be formed using plasma CVD, sputtering, or the like, for example. The same material as that of the interlayer insulating film can be used as the material of the dielectric film. The dielectric film may be a single-layer film or a multilayer film having two or more layers. Here, the dielectric film is formed, for example, by sequentially layering a silicon nitride ($SiN_x$) film and a silicon dioxide ($SiO_2$) film through CVD.

Although the dielectric film is typically deposited on substantially the entire surface of the substrate 11, the dielectric film may be patterned so as to cover the lower-layer electrode 32c but expose the conductive layer 32q and the organic insulating layer 24 in the periphery thereof, as illustrated in FIG. 7(a). In other words, the dielectric film may be removed, through patterning, from the region to serve as the non-display region of the display device.

Next, the upper-layer electrode 36p is formed on the dielectric layer 34, as illustrated in FIG. 7(b). More specifically, a transparent conductive film is deposited on the dielectric layer 34 through sputtering or the like. The same material as that of the lower-layer electrode 32c can be used as the material of the upper-layer electrode 36p. The upper-layer electrode 36p is formed by then patterning the transparent conductive film using a photolithography process.

Next, the photospacer 38 is formed on the dielectric layer 34 using the same method as in the process for forming the photospacer in the TFT substrate 100A. Next, plasma processing is carried out using a gas that contains a fluorine-based gas but does not contain oxygen gas, as illustrated in FIG. 7(c). Note that in the case where the plasma processing is carried out under the same conditions as those given in the descriptions of the method of manufacturing the TFT substrate 100A, the effect of the plasma processing on the dielectric layer 34 is small enough to be ignored.

The TFT substrate 100C illustrated in FIG. 6 is obtained as a result.

Plasma processing using a gas that contains a fluorine-based gas but does not contain oxygen gas is used to remove PS residue in the above-described manufacturing method as well, and thus PS residue on the upper-layer electrode 36p that functions as a pixel electrode or a common electrode can be removed while also suppressing a drop in the size of the photospacer 38. Additionally, even in the case where the dielectric film is removed through patterning from the region to serve as the non-display region of the display device, PS residue can be removed while also preventing an electrode and/or a wire formed on that region so as to make contact with the organic insulating layer 24 from separating.

Although the foregoing describes a TFT substrate for a liquid crystal display device that displays in an FFS (Fringe Field Switching) mode as an example, an active matrix substrate obtained through the manufacturing method described above with reference to FIGS. 7(a) to (c), such as the TFT substrate 100C, can also be used in a liquid crystal display device that displays in a display mode in which a vertical electric field is applied to the liquid crystal layer, such as a VA mode, for example. In this case, an auxiliary capacitance voltage (Cs voltage) is supplied to the lower-layer electrode 32c, and the lower-layer electrode 32c functions as an auxiliary capacitance electrode (auxiliary capacitance wire). In other words, an auxiliary capacitance can be formed by the lower-layer electrode 32c and upper-layer electrode 36p, and the dielectric layer 34 located therebetween. Note that it is not absolutely necessary to form the slits 36S in the upper-layer electrode 36p in the case of displaying in a display mode in which a vertical electric field is applied to the liquid crystal layer.

Additionally, although the above describes a TFT substrate having the organic insulating layer 24 on the interlayer insulating layer 22 as an example, it is not absolutely necessary to form the organic insulating layer 24. However, forming the comparatively thick (approximately 1 μm to 3 μm, for example) organic insulating layer 24 using an organic insulative material makes it possible to dispose the pixel electrode so as to overlap with a gate bus line or a source bus line. This is because compared to an inorganic insulative material, an organic insulative material has the advantages of having a lower permittivity and/or being easier to form at higher thicknesses, and thus parasitic capacitance formed between the pixel electrode and a gate and/or source bus line is low even if the pixel electrode is disposed so that a peripheral portion thereof overlaps with the gate and/or source bus line with the organic insulating layer interposed therebetween. An effect is thus achieved in which a pixel aperture ratio can be improved more than in the case where the pixel electrode is disposed so that the pixel electrode and the gate and/or source bus line do not overlap.

An example of a display device in which the above-described TFT substrates 100A to 100C can be used and an example of a method of manufacturing such a display device will be described next.

Figure 8:
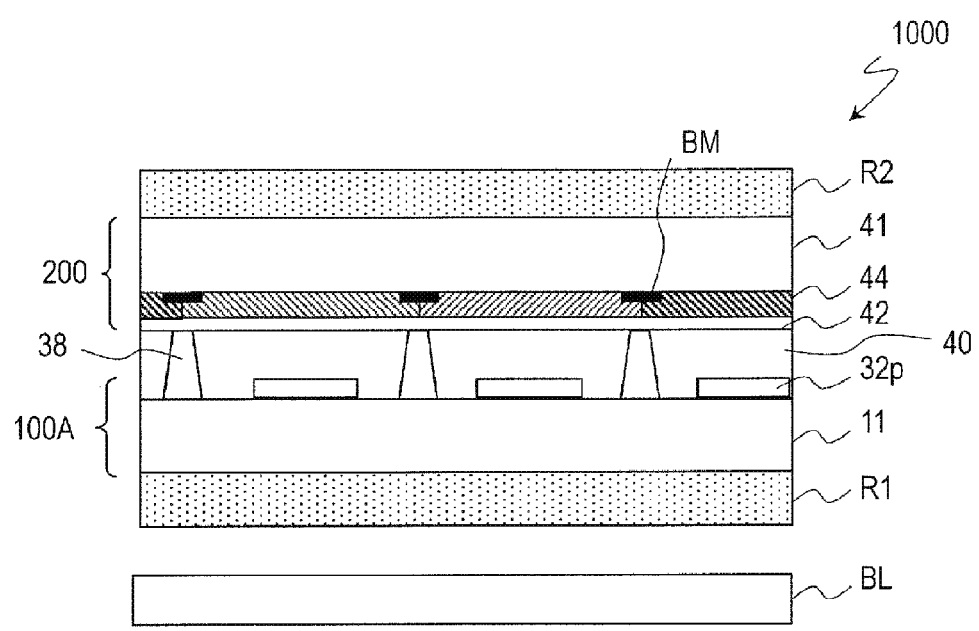
FIG. 8 is a schematic cross-sectional view of a display device including the TFT substrate 100A.
Figure 9:
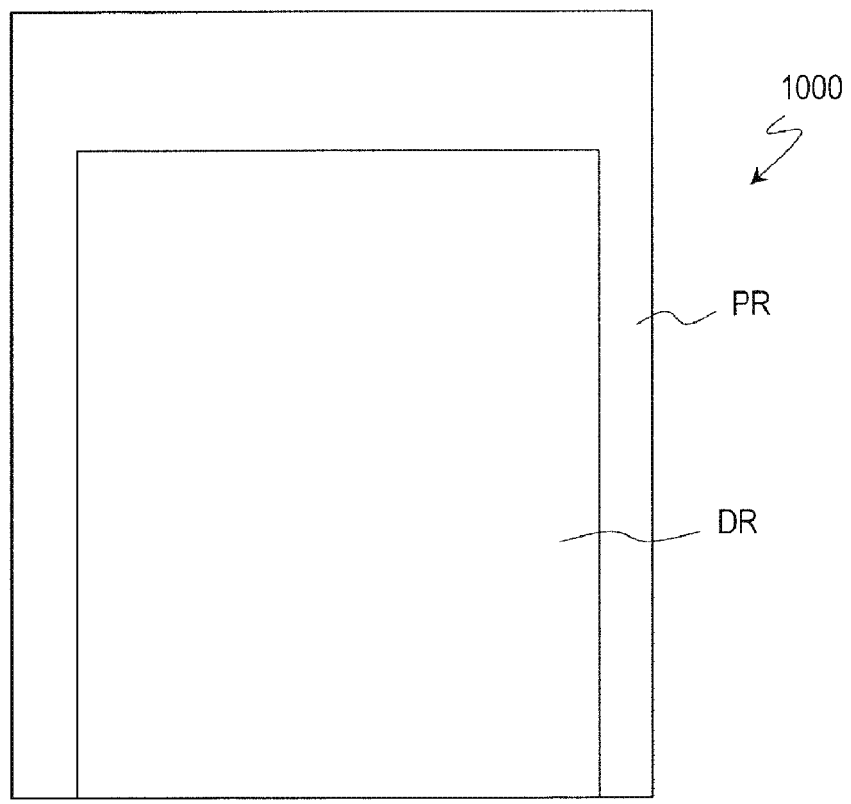
FIG. 9 is a schematic plan view of the display device including the TFT substrate 100A.

FIGS. 8 and 9 are a schematic cross-sectional view and plan view, respectively, of a display device including the TFT substrate 100A. A display device 1000 illustrated in FIGS. 8 and 9 includes the TFT substrate 100A (an active matrix substrate), an opposite substrate 200 that opposes the TFT substrate 100A, and a display medium layer 40 disposed between the TFT substrate 100A and the opposite substrate 200. In the display device 1000, photospacers are not formed on the opposite substrate 200. As illustrated in FIG. 9, the display device 1000 has a display region DR in which a plurality of pixels are arranged in a matrix and a peripheral region PR provided in the periphery of the display region DR.

The display device 1000 is a transmissive liquid crystal display device, for example. In other words, the display medium layer 40 is a liquid crystal layer, for example, and the display device 1000 includes polarizing plates R1 and R2 disposed on outer sides of the TFT substrate 100A and the opposite substrate 200, respectively, and a backlight unit BL that emits display light toward the TFT substrate 100A. Depending on the display mode, a vertical orientation film or a horizontal orientation film (not shown) is provided on the liquid crystal layer-side surface of at least one of the TFT substrate 100A and the opposite substrate 200. The orientation film provided on the TFT substrate 100A and/or the opposite substrate 200 may be an optical orientation film that has undergone an optical orientation process.

The opposite substrate 200 includes a black matrix BM and a color filter 44. As illustrated in FIG. 8, the photospacers 38 and the black matrix BM are disposed so that the black matrix BM of the opposite substrate 200 overlaps with the photospacers 38 on the substrate 11 when the opposite substrate 200 is laminated to the TFT substrate 100A. An opposite electrode 42 is disposed on the surface of the color filter 44 located on the display medium layer 40 side in the case where a vertical electric field mode, such as a VA mode, is employed. In the case where a horizontal electric field mode, such as an FFS mode, is employed, the opposite electrode is formed in the TFT substrate, and the opposite substrate 200 does not have an opposite electrode.

The display device 1000 illustrated in FIGS. 8 and 9 is obtained as follows. First, the TFT substrate (active matrix substrate) 100A is manufactured through the manufacturing method described above. Next, the opposite substrate 200 is prepared. Then, the opposite substrate 200 and the TFT substrate 100A are laminated together so that the opposite substrate 200 opposes the TFT substrate 100A. Next, the display medium layer (liquid crystal layer) 40 is formed by injecting a liquid crystal material into a gap between the opposite substrate 200 and the TFT substrate 100A in a vacuum state. In the case where the one drop filling (ODF) technique is used, the liquid crystal material is first dropped onto one of the substrates, and that substrate is then laminated to the other substrate.

The liquid crystal display device according to this embodiment of the present invention is not limited to the example described above, and can be applied broadly in a variety of liquid crystal display devices having photospacers. Additionally, the display device according to this embodiment of the present invention is not limited to liquid crystal display devices, and can be applied broadly in a variety of display devices having photospacers.

INDUSTRIAL APPLICABILITY

Embodiments of the present invention can be applied broadly in display devices including active matrix substrates, such as liquid crystal display devices having various types of display modes.

DESCRIPTION OF REFERENCE CHARACTERS 10 thin film transistor (TFT)
11 substrate
16 semiconductor layer
17 etching stop layer
22 interlayer insulating layer
24 organic insulating layer
32p pixel electrode
32q conductive layer
32c lower-layer electrode
34 dielectric layer
36p upper-layer electrode
36S slit
38 photospacer
40 display medium layer
100A-100C TFT substrate (active matrix substrate)
1000 display device

What is claimed is:

1. A method of manufacturing an active matrix substrate that includes a substrate, and a thin film transistor and photospacer supported on the substrate, the method comprising:
   a step (a) of forming the thin film transistor on the substrate;
   a step (b) of forming an interlayer insulating layer covering the thin film transistor;
   a step (c) of forming a first electrode after the step (b);
   a step (d) of forming, after the step (c), the photospacer by applying a photosensitive resin material to the substrate and patterning said photosensitive resin material; and
   a step (e) of performing, after the step (d), plasma processing using a gas that contains a fluorine-based gas but that does not contain oxygen gas,
   wherein the method further comprises, after the step (b) and before the step (c):
      a step (b1) of forming an organic insulating layer on the interlayer insulating layer;
      a step (b2) of forming a second electrode on the organic insulating layer; and
      a step (b3) of forming a dielectric layer on the second electrode,
   wherein in the step (c), the first electrode is formed on the dielectric layer,
   wherein the step (b2) includes a step of forming a conductive film on the organic insulating layer so as to connect to the organic insulating layer and a step of forming the second electrode and forming another conductive layer separate from the second electrode by patterning the conductive film,
   wherein the step (b3) includes a step of forming a dielectric film on the second electrode and on the conductive layer and a step of patterning the dielectric film so as to cover the second electrode but expose the conductive layer and the organic insulating layer in a periphery of the conductive layer.

2. A method of manufacturing a display device that includes an active matrix substrate, an opposite substrate that opposes the active matrix substrate, and a display medium layer disposed between the active matrix substrate and the opposite substrate, the method comprising:
   a step (A) of manufacturing the active matrix substrate according to the method of manufacturing the active matrix substrate according to claim 1;
   a step (B) of preparing the opposite substrate;
   a step (C) of bonding the opposite substrate and the active matrix substrate together so that the opposite substrate opposes the active matrix substrate; and
   a step (D) of forming the display medium layer before or after the step (C).

3. The method of manufacturing the display device according to claim 2, wherein the display medium layer is a liquid crystal layer.

4. A display device manufactured via the method of manufacturing according to claim 2.

5. A method of manufacturing an active matrix substrate that includes a substrate, and a thin film transistor and photospacer supported on the substrate, the method comprising:
   a step (a) of forming the thin film transistor on the substrate;
   a step (b) of forming an interlayer insulating layer covering the thin film transistor;
   a step (c) of forming a first electrode after the step (b);
   a step (d) of forming, after the step (c), the photospacer by applying a photosensitive resin material to the substrate and patterning said photosensitive resin material; and
   a step (e) of performing, after the step (d), plasma processing using a gas that contains a fluorine-based gas but that does not contain oxygen gas;
   wherein the method further comprises after the step (b) and before the step (c):
      a step (b1) of forming an organic insulating layer on the interlayer insulating layer;
      a step (b2) of forming a second electrode on the organic insulating layer; and
      a step (b3) of forming a dielectric layer on the second electrode,
   wherein in the step (c), the first electrode is formed on the dielectric layer,
   wherein the step (b2) includes a step of forming a conductive film on the organic insulating layer so as to connect to the organic insulating layer and a step of forming the second electrode and forming another conductive layer separate from the second electrode by patterning the conductive film,
   wherein the step (b3) includes a step of forming a dielectric film on the second electrode and on the conductive layer and a step of patterning the dielectric film so as to cover the second electrode but expose the conductive layer and the organic insulating layer in a periphery of the conductive layer,
   wherein in the step (e), the plasma processing is performed substantially using only a fluorine-based gas, and
   wherein the fluorine-based gas is a $CF_4$ gas or a $C_2F_6$ gas.

6. A method of manufacturing an active matrix substrate that includes a substrate, and a thin film transistor and photospacer supported on the substrate, the method comprising:

a step (a) of forming the thin film transistor on the substrate;

a step (b) of forming an interlayer insulating layer covering the thin film transistor;

a step (c) of forming a first electrode after the step (b);

a step (d) of forming, after the step (c), the photospacer by applying a photosensitive resin material to the substrate and patterning said photosensitive resin material; and a step (e) of performing, after the step (d), plasma processing using a gas that contains a fluorine-based gas but that does not contain oxygen gas;

wherein the method further comprises after the step (b) and before the step (c):

a step (b1) of forming an organic insulating layer on the interlayer insulating layer;

a step (b2) of forming a second electrode on the organic insulating layer; and a step (b3) of forming a dielectric layer on the second electrode, wherein in the step (c), the first electrode is formed on the dielectric layer, wherein the step (b2) includes a step of forming a conductive film on the organic insulating layer so as to connect to the organic insulating layer and a step of forming the second electrode and forming another conductive layer separate from the second electrode by patterning the conductive film, wherein the step (b3) includes a step of forming a dielectric film on the second electrode and on the conductive layer and a step of patterning the dielectric film so as to cover the second electrode but expose the conductive layer and the organic insulating layer in a periphery of the conductive layer, and wherein the fluorine-based gas is a $CF_4$ gas or a $C_2F_6$ gas.

* * * * *